US006717424B2

(12) United States Patent
Furuta

(10) Patent No.: US 6,717,424 B2
(45) Date of Patent: Apr. 6, 2004

(54) ELECTRODE AND FIXTURE FOR MEASURING ELECTRONIC COMPONENTS

(75) Inventor: Masaji Furuta, Hyogo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/402,222

(22) Filed: Mar. 28, 2003

(65) Prior Publication Data

US 2003/0184331 A1 Oct. 2, 2003

Related U.S. Application Data

(63) Continuation of application No. 09/702,228, filed on Oct. 31, 2000, now Pat. No. 6,593,762.

(30) Foreign Application Priority Data

| Nov. 1, 1999 | (JP) | ............................................. 11-311689 |
| Nov. 1, 1999 | (JP) | ............................................. 11-311690 |

(51) Int. Cl.[7] ............................................... G01R 31/28
(52) U.S. Cl. ..................................... 324/755; 324/158.1
(58) Field of Search ................................. 324/754, 755, 324/761, 762, 765, 158.1; 439/507, 510; 174/267, 262, 264; 361/774

(56) References Cited

U.S. PATENT DOCUMENTS

| 2,588,726 A | * | 3/1952 | Hoover ........................ 439/189 |
| 3,307,246 A | * | 3/1967 | Gulliksen et al. .............. 29/874 |
| 5,175,491 A | * | 12/1992 | Ewers ......................... 324/755 |
| 5,966,020 A | * | 10/1999 | Rampone et al. ............ 324/755 |

* cited by examiner

Primary Examiner—Vinh P. Nguyen

(57) ABSTRACT

A platform for testing electronic parts and electrode used in the same for easy and accurate testing of a three-terminal device. The platform for testing electronic parts of the present invention comprises pressing means, DUT guide means, and electrode board. The pressing means presses DUT to the electrode board and maintains electrical and mechanical contact between the DUT terminals and the electrode groups. The DUT guide means hold the DUT while moving so that the relative position of the DUT to the electrode board is changed and the DUT moves between a plurality of specific positions. The electrode board has multiple electrode groups arranged corresponding to terminals of the DUT. The DUT is connected to test circuits corresponding to each of these electrode groups so that terminals of the DUT are connected to the corresponding test circuit when the DUT is placed at multiple specific positions on the above-mentioned electrode board. By means of this structure, the inductance error component of the electrodes can be extensively removed, while facilitating switching between testings of each element of a three-terminal device. Furthermore, by making the surface region of each electrode that can contact DUT a curved surface, such as a cylindrical shape or spherical shape, slight elastic deformation will occur at the region that contacts the DUT. As a result, strong surface pressure can be obtained with a relatively small load and contact resistance is stabilized.

5 Claims, 10 Drawing Sheets

ELECTRODE AND FIXTURE FOR MEASURING ELECTRONIC COMPONENTS

This application is a continuation of Ser. No. 09/702,228 filed Oct. 31, 2000, now U.S. Pat. No. 6,593,762.

BACKGROUND OF THE INVENTION

1. Field of the Invention

The present invention pertains to a tool for testing chip-shaped electronic parts that do not have terminal lead wires, such as SMT devices, etc., and particularly to a platform for testing electronic parts that is appropriate for testing 3-terminal devices using high-frequency test signals. The present invention further pertains to an electrode structure for improving test stability.

2. Description of the Related Art

As is shown in FIG. 1, a conventional platform for testing 3-terminal SMT devices has clip means 12 that support the device under test (referred to below as the DUT) by sandwiching each terminal part of the device. Consequently, clip means 12 function as test electrodes and the test circuit shown in FIG. 2(a) is formed by connecting platform body 13 to a testing device (not shown) via testing device connector 14. However, by means of this structure, inductance L is produced by the length of the clip, as shown in the figure, and when this is combined with load capacities C's of the DUT and resistance R of the clip, the combination forms impedance Z1, which is connected parallel to the resonator, i.e. the DUT, as shown in FIG. 2(b). This inductance L cannot be neglected when measuring impedance with high-frequency signals and therefore, creates errors in the measurement results of the DUT.

On the other hand, methods have also been adopted that alleviate the need of such error correction by testing a DUT directly soldered to a DUT board so that the test conditions will be the same as the conditions under which the DUT is used. In this case, the errors in the test data that are obtained are minimal. However, the form of connection to the testing device, which varies in accordance with the test parameters, varies with the type of DUT An example of a device that requires multiple forms of connection to a testing device is a ceramic resonator that is used for clock generation in various microcomputers. However, there are a total of three elements, two load capacities and 1 resonator, that are to be measured of subjects of this device, as shown in FIG. 2(a). In such a case, three forms of connections are necessary when these tests are performed, as shown in FIG. 3 (a DUT testing method by these 3 forms of connections is described in detail in Japanese Kokai Patent No. Hei 8(1996)-292,219). Consequently, in order to test each of the three elements, each of the these tests must require a specific DUT board with a different wiring from ones for the others.

Furthermore, using a switch box to switch the test path during testing, as disclosed in the previously filed Japanese Kokai Patent No. Hei 8(1996)-292,219, is well-known as a means for changing the form of connection of the DUT to the testing device. However, there are still the above-mentioned problems of inductance and anchoring the DUT to the electrodes when the DUT terminals are connected to the platform of the switch box.

Furthermore, test platforms for the above-mentioned soldering method not only have detrimental results in that the test procedure is complicated and costly, but also have the problem of being impossible to use the DUT as a final product if it is soldered to the test platform, such as a DUT board. Thus, they have the disadvantage of not being suitable for testing in mass-production lines.

Test platforms in which a DUT is mounted on an electrode group that has been set up on a test platform and a member that presses on the surface of the DUT opposite the surface that has made contact with the electrode group are generally known and are referred to herein as a conventional test platform with which DUTs can be interchangeably tested. Contact resistance between the DUT terminal and the electrodes on the test platform is often a problem related to the conventional test platform. This contact resistance has the tendency of not changing any lower after the surface pressure at this same contact surface exceeds a certain threshold value. Consequently, the method whereby a load applied to the DUT is increased so that the surface pressure reaches the threshold value in order to obtain the desired surface pressure is considered method of obtaining stable contact resistance. However, the electrode of SMT-type devices has a flat surface and it is difficult to obtain sufficient surface pressure with flat-surface electrodes on a conventional test platform. This surface pressure is generally found by dividing the load M pressing from DUT top surface by the surface area S of contact between DUT electrode and test platform electrode wherein the load M is limited to the allowable load to the DUT. On the other hand, it would appear that surface pressure would increase with a reduction in surface area S, but in the case of electrodes with a flat surface, the surface pressure when the terminal surface of the DUT contacts the flat surface of the electrode and the surface pressure when it touches the corner of the end of the electrode are generally very different and consequently contact resistance varies markedly with how the DUT is set up. If surface area S of this flat-surface electrode is too small, the DUT will disconnect from the electrode. Consequently, the minimum necessary surface area must be maintained for stable connection of the DUT to the platform and there is a limit to the allowable reduction of the surface area of a flat-surface electrode. Moreover, simply increasing the load, even if it is within the range of the allowable load to the DUT, will also lead to changes in measured values, and the pressing structure itself of the test platform will also be complex and large. Consequently, the necessary and sufficient contact surface pressure is not obtained, and it is difficult to retain reproducibility in test with the conventional structure under conditions where high-frequency microcurrent serves as the measurement signals.

Thus, in accordance with the prior art testing platform devices, there is a contradictory relationship between the exchangeability of DUTs and the improvement of accuracy and reproducibility of the test, and therefore, optimal means for solving the two issues simultaneously could not obtained.

SUMMARY OF THE INVENTION

Consequently, one object of the present invention is to provide a test platform in which inductance due to the length of the test electrode, which was a problem in the past, can be greatly reduced while being able to anchor DUTs interchangeably. Another object of the present invention is to easily provide multiple forms of connection of a DUT to a test device.

Yet another object of the present invention is to provide a test platform for testing electronic parts having a wide range of applications in which there are provided stable contact with various sizes and shapes of SMT devices.

Still another object of the present invention is to improve the structure of the electrodes, which are the electrical contact points of a DUT terminal, and thereby make simple and stable anchoring of the DUT to the test platform possible, and improve test reproducibility by stabilizing contact resistance.

The platform for testing electronic parts of the present invention has the following structure in order to achieve the above-mentioned objects: it has an electrode board, which has a plurality of electrode groups, each in an arrangement that corresponds to terminals of the device under test (DUT). The electrode groups are connected to the corresponding test circuit so that each terminal of the DUT is connected to the corresponding test circuit when the DUT is placed at each of multiple specific positions on the electrode board. A DUT guide means is provided, which holds the DUT and operates so that it changes the relative position of the DUT to the electrode board to travel the multiple specific positions. And a pressing means is provided, which presses the DUT to the electrode board and maintains electrical and mechanical contact between the terminals of the DUT and the electrode groups.

Moreover, by means of the platform for testing electronic parts of the present invention, the electrode board is anchored to the body of the platform for testing electronic parts, the DUT guide means has a sliding connection means that connects the DUT guide means to the body so that it can slide back and forth and has a DUT guide plate, in which an opening that matches the shape of the DUT is formed and with which the DUT is held inside the opening to demarcate the position of the DUT on the plane of movement, and the pressing means is connected to the DUT guide means and presses the top surface of the DUT toward the electrode board through the opening in the DUT guide plate.

Moreover, by means of the present invention, the pressing means has a load adjustment means for adjusting the load applied to the top surface of the DUT.

In addition, the platform for testing electronic parts of the present invention further has a means for retaining a desired relative position between the DUT guide means and the electrode board so that the DUT is placed at each of the multiple specific positions on the electrode board.

The platform for testing electronic parts of the present invention can further have three-dimensional shapes of electrodes (i.e., no-planar or -flat surfaces) forming the electrode groups of the same electrode board. For instance, at least one of the electrodes forming the electrode group can be provided with a spherical surface. The surface can also be shaped as a cylindrical shape.

In further detail, the electrode of the present invention can have the following structure: the electrode of the present invention is characterized in that it is anchored to a platform for testing electronic parts so that it projects from the top of the surface where a device under test (DUT) is set up, and in that the region that contacts a DUT is subject to elastic deformation when a load is applied under conditions such that the surface region capable of contacting the DUT forms a curved surface and the DUT is set up in the above-mentioned surface region. Moreover, in accordance with the present invention, the above-mentioned surface region of the electrode can be cylindrical in shape. The above-mentioned surface region can also be a spherical surface. Furthermore, one embodiment of the cylindrical electrode of the present invention is a cylindrical wire folded into an U-shaped form where the region of contact with the DUT is in the center block of the folded wire. Moreover, in an embodiment of the present invention having a spherical-surface electrode, the electrode is a pin-shaped member, the tip of which has a spherical surface, and the region of contact with the DUT is at the tip. Furthermore, by setting up a pressing mechanism for pressing the DUT to these electrodes using these electrode structures, it is possible to realize a platform for testing electronic parts with improved test stability. For example, by lining up two of the above-mentioned cylindrical electrodes in a row and placing one of the above-mentioned spherical electrodes at an equal distance from the ends of these electrodes that face one another, it is possible to stabilize a three-terminal device, and a platform for testing electronic parts that can cover devices of various sizes within a specific range can be realized.

DESCRIPTION OF SYMBOLS

51. DUT
52. Pressing means
53. DUT guide means
54. Electrode board

DETAILED DESCRIPTION OF THE INVENTION

Examples that are considered to be preferred embodiments at the present time will be now described in detail below in reference to the associated figures. Structural elements with the same reference number in the figures have the same function throughout all of the figures.

An example that incorporates the present invention in a platform for testing, for instance, a resonator and two load capacities as the device under test with 3 terminals will be described below. However, the present invention is not limited to the examples presented herein and persons skilled in the art will appreciate that revisions and modifications to the present invention, for example, to the numbers of test terminals and test parameters, can be made without departing from the scope of the present invention.

Figure 4:
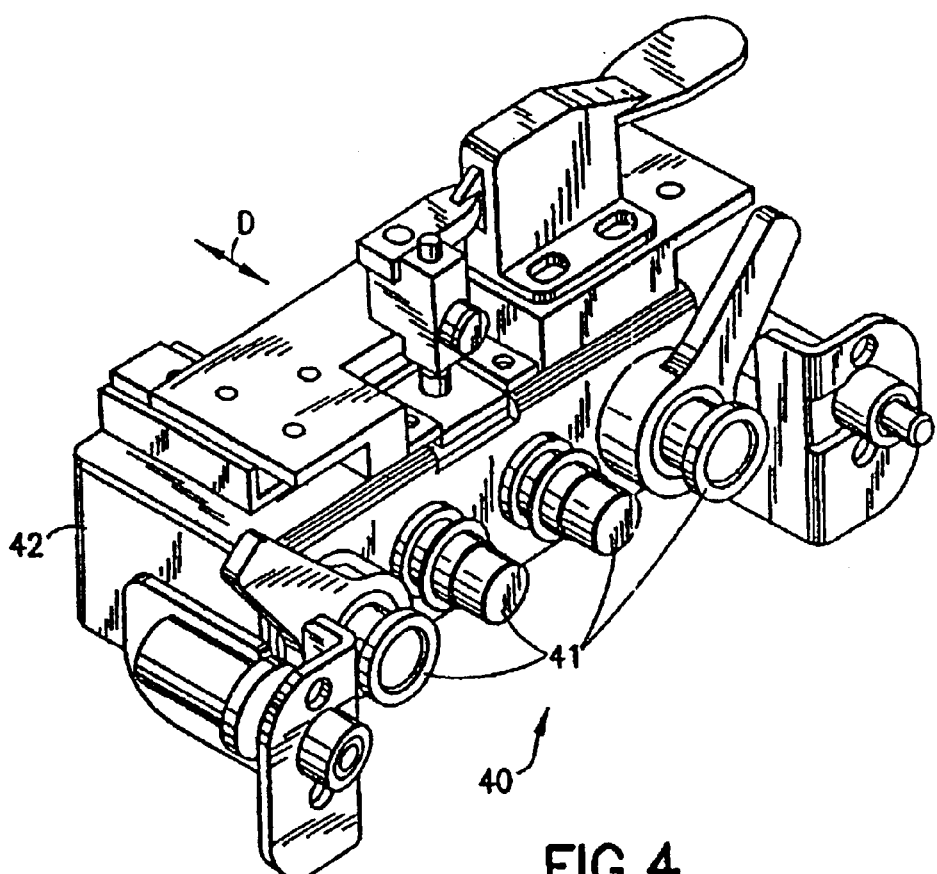
FIG. 4 is a prospective view of the platform for testing electronic parts that is an example of the present invention.
Figure 5:
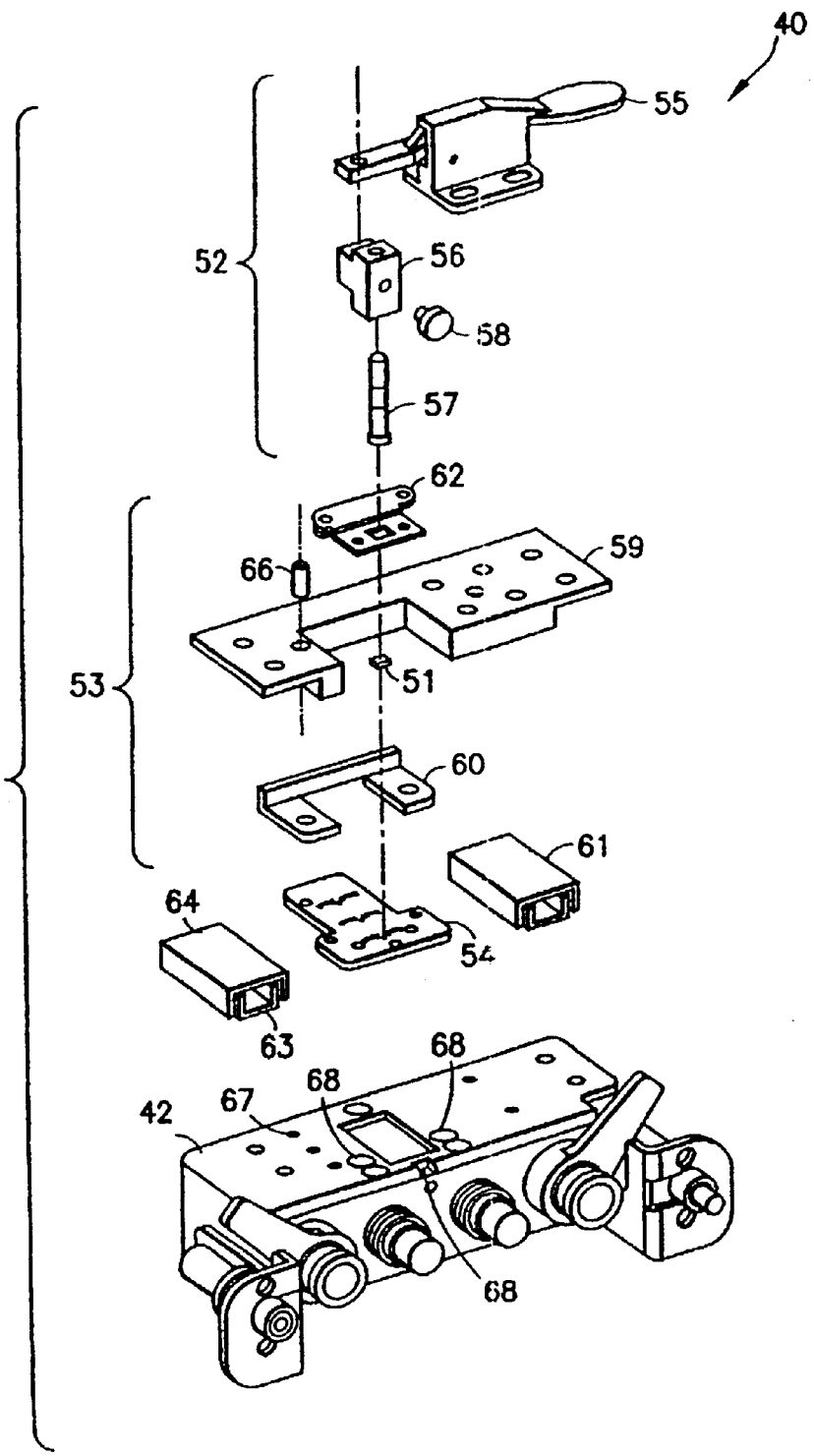
FIG. 5 is a prospective view of the platform for testing electronic parts that is an example of the present invention broken down into parts.

FIG. 4 is a perspective view of a platform for testing electronic parts 40 that is an embodiment of the present invention, and FIG. 5 is an exploded perspective view of the platform 40. As is shown in these figures, in addition to wiring and body 42 which has connector group 41 for connection to the testing device (not shown), platform 40 has DUT pressing means 52 for pressing DUT 51 to the electrode, DUT guide means 53 for aligning DUT 51 at the desired position, and electrode board 54 which has electrodes for electrical connection to the testing device. DUT pressing means 52 is comprised of clamp unit 55, holder 56 anchored to the clamp unit 55, rod 57, which passes through said holder 56 so that it can slide back and forth, and knob 58 for anchoring said rod 57 to holder 56. Holder 56 has a first vertical through-hole therethrough and into which rod 57 can pass and a second through-hole with screw threads that communicate with and is perpendicular to the first through-hole (nut). Knob 58 has screw threads that engage with the second through-hole. By turning knob 58, it is possible to engage/disengage rod 57 to the holder 56 and the rod can be anchored by adjusting the position of the tip of rod 57 in the lengthwise direction as needed. Thus, the position of the rod can be adjusted as needed in accordance with the thickness of the DUT. By means of this type of structure, rod 57 is moved up and down together with the holder by operating clamp unit 55 and the tip of rod 57 presses the top surface of DUT 51 when clamp unit 55 is in the lock position. The force of this pressing is adjusted by adjusting the length of rod 57. Clamp unit 55 can interchangeably connect/disconnect DUT 51 to electrode board 54 and has a conventional latch mechanism. The details of clamp unit 55 are known to persons skilled in the art and will not be explained in particular detail here. Various mechanisms under which the above-mentioned movement is obtained can be used.

DUT guide means 53 comprises of slide base 59, angle 60, two slide units 61, and guide plate 62 (that is taken off in FIG. 4). As shown in the FIG. 5, slide unit 61 is comprised of two members 63,64 that have been combined one on the other so that one member can slide on the other. Bottom member 63 is anchored to body 42 and top member 64 is anchored to slide base 59. As a result, slide base 59 is set up so that it can slide on body 42. It is also possible to introduce ball bearings to slide unit 61 in order to improve the sliding performance of the slide base. Guide plate 62 is anchored to angle 60 and said angle 60 is anchored to slide base 59 to form a single unit with the slide base. An opening that matches the shape and size of DUT 51 is made in the center of guide plate 62 and when the DUT is engaged in this opening, it can move on electrode board 54 as slide base 59 moves. Consequently, it is possible to change the position of the DUT on the electrode board by moving slide base 59 in the direction of arrow D in FIG. 4. The angle 60 plays the role of a handle so that the user can easily move slide base 59 and it is not always necessary. Guide plate 62 is anchored to slide base 59 via angle 60 in the present example, but it can also be directly anchored to the slide base 59. Moreover, it is possible to use guide plates with different shapes and sizes in accordance with different types of DUTs and switch to the corresponding guide plate when DUTs of different types are being tested.

Figure 1:
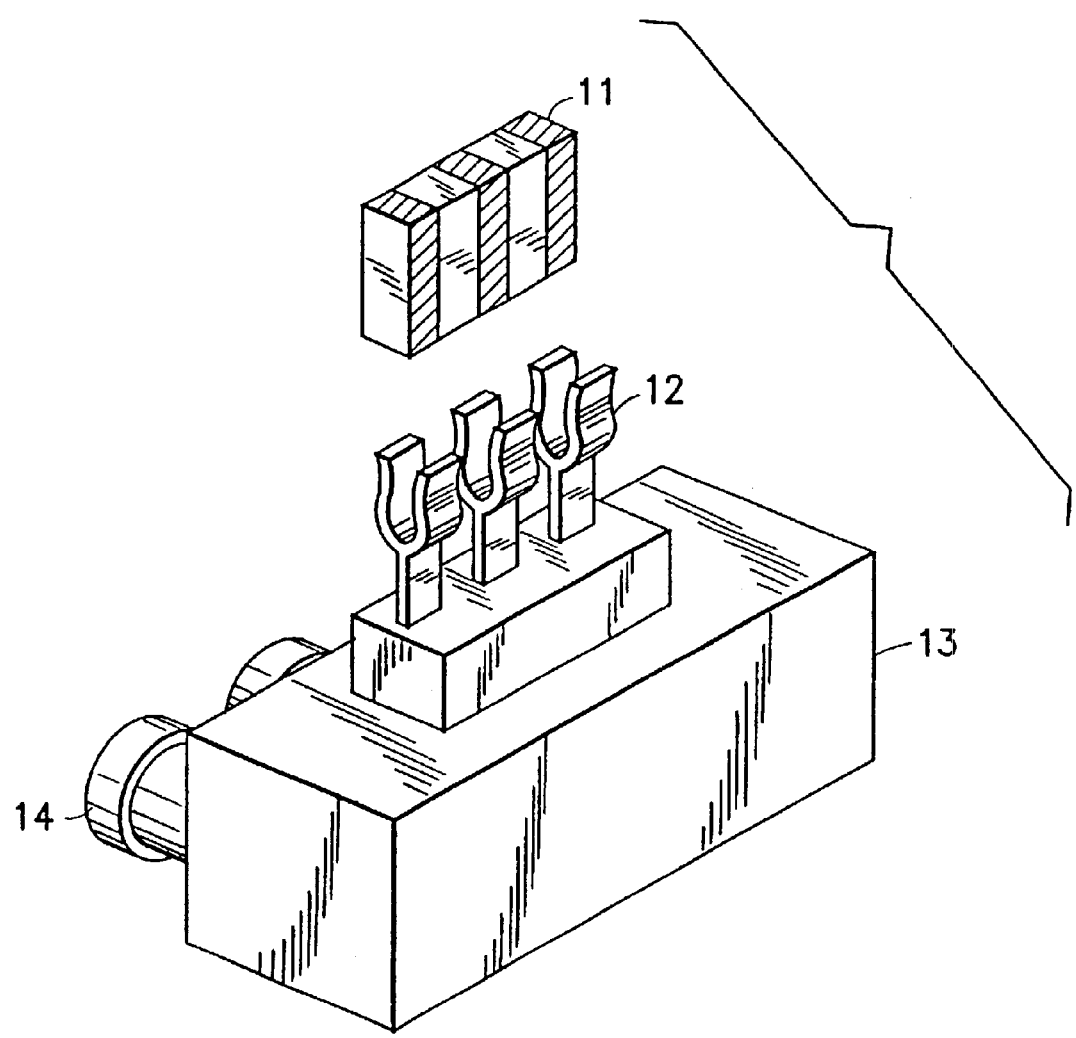
FIG. 1 shows a platform for testing electronic parts of the prior art.
Figure 2A:
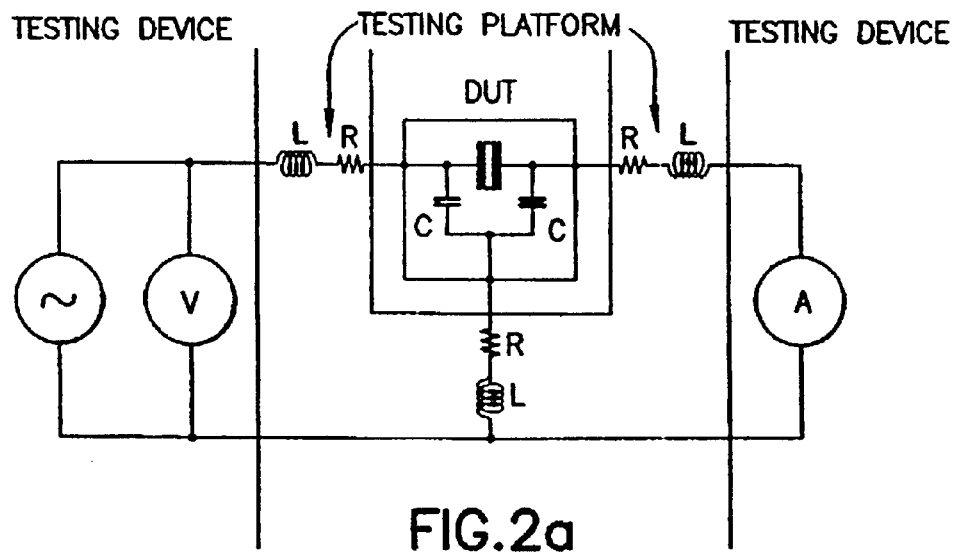
FIG. 2 shows the 3-terminal device testing circuit and its impedance equivalent circuit.
Figure 2B:
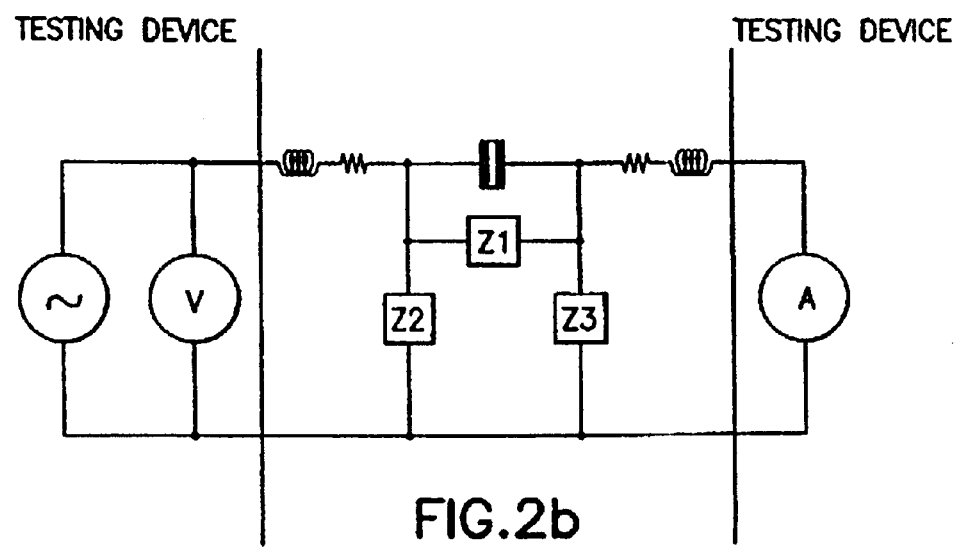
Figure 3A:
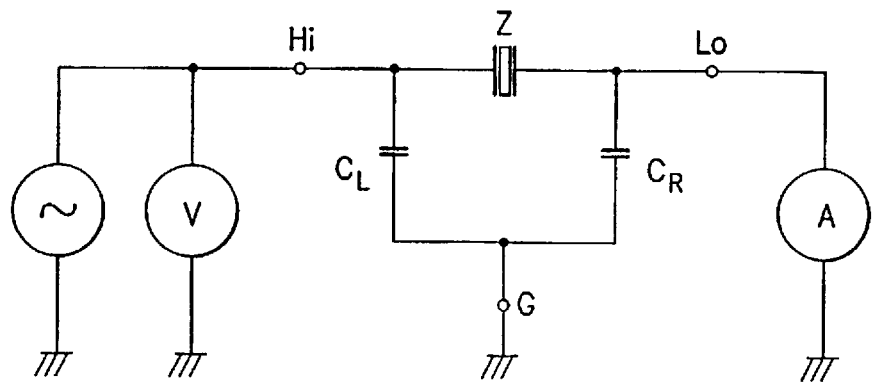
FIG. 3 shows 3 forms of connection of the test circuit of the 3-terminal device.
Figure 3B:
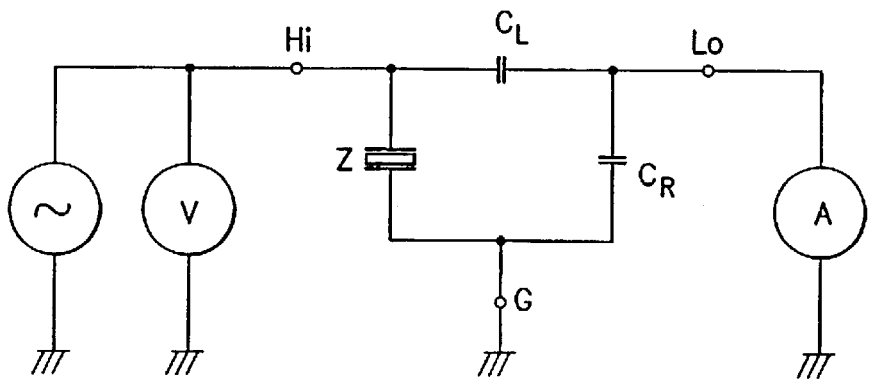
Figure 3C:
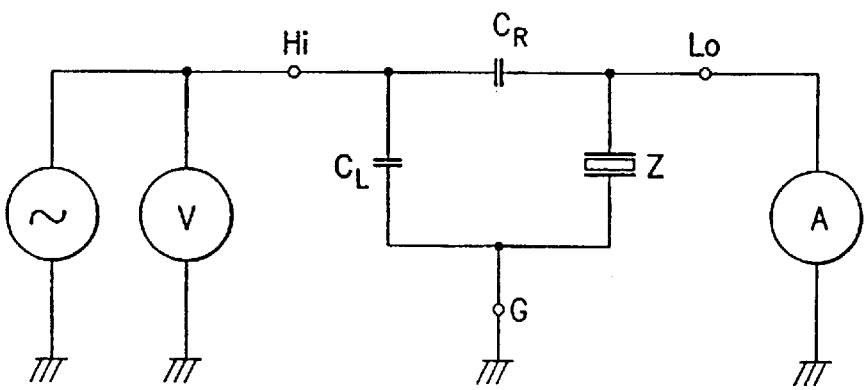
Figure 6:
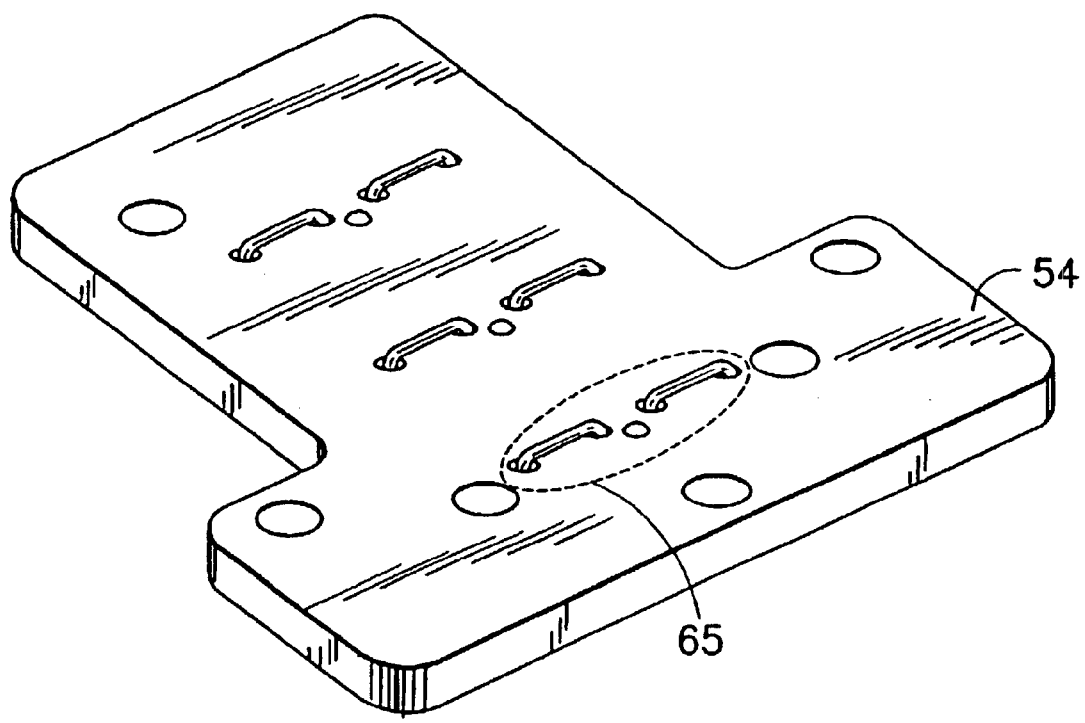
FIG. 6 is a prospective view of an electrode board of an example of the present invention.
Figure 7:
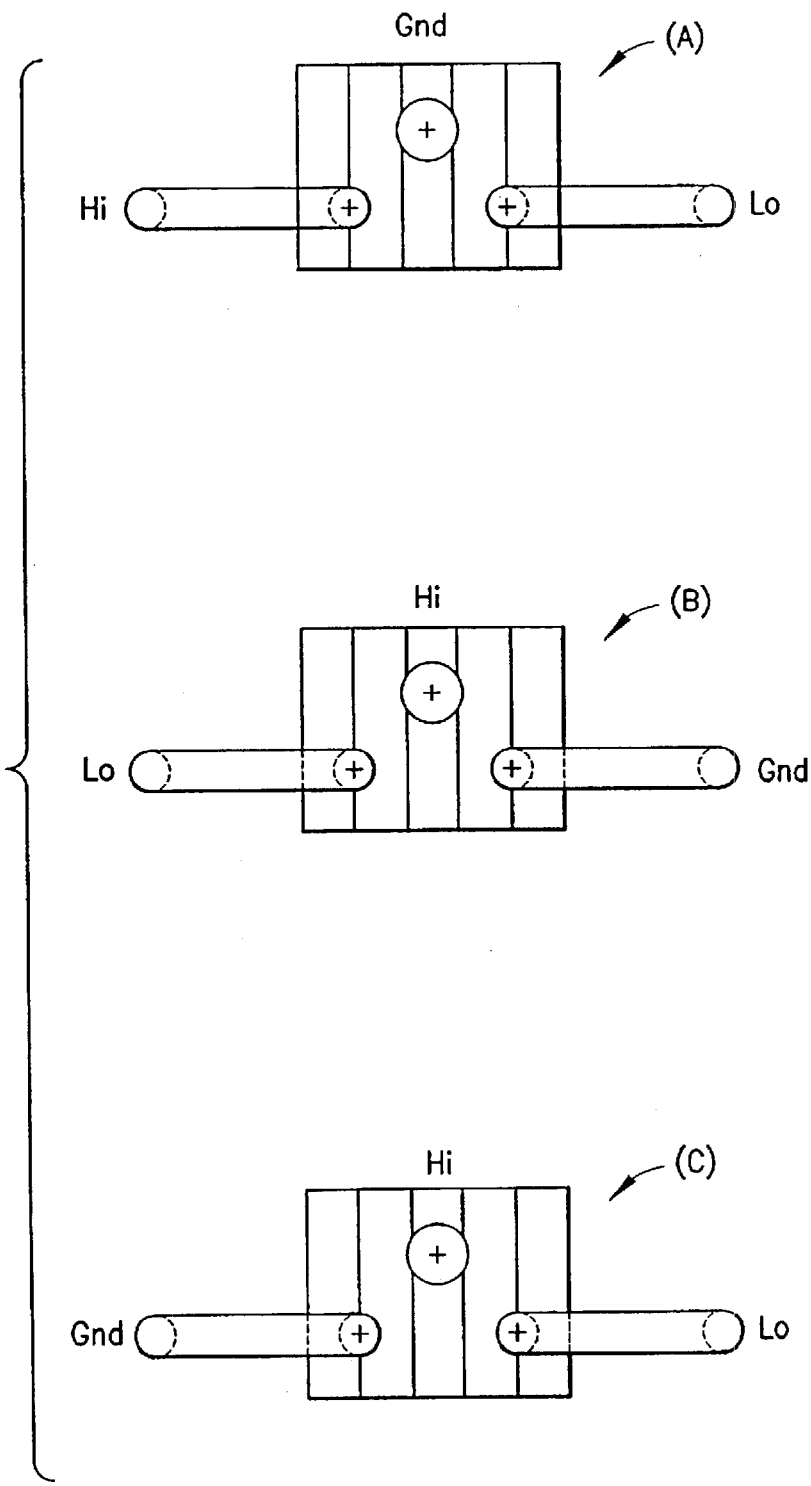
FIG. 7 explains how the DUT is placed on the electrode board in FIG. 6.

As shown in FIG. 6, a plurality of electrode groups 65 corresponding to desired forms of connection are placed on electrode board 54 and wiring for testing that corresponds to each electrode group is placed on the electrode board and connected to these electrodes. Although not illustrated, the electrode board can be a PC board (printed circuit board) incorporating the necessary wiring for testing therein. In the case of the present example, it is assumed that an resonator with load capacities, which is represented by the equivalent circuit in FIG. 2, is used as the DUT. The DUT comprises one resonator and two load capacities. Consequently, the circuits shown in FIGS. 3a–3c must be formed for testing these three elements (Z, $C_L$, $C_R$). Each electrode group forms individual wiring to connector 41 of the body so that each circuit for testing these elements is formed. Specifically, electrode pads (not illustrated) corresponding to Hi, Lo and G of the testing device are formed on the back surface of electrode board 54 and these electrode pads are each connected to the respective Hi, Lo and G electrodes 68 on the surface of the platform for testing when electrode board 54 is connected to platform 42 for testing. Thus, the DUT is connected to the testing device with the form of connection of test circuit (a) in FIG. 3a at position A shown in FIG. 7, with the form of connection of test circuit (b) shown in FIG. 3b at position B in FIG. 7, and with the form of connection of test circuit (c) shown in FIG. 3c at position C in FIG. 7. Consequently, each element inside the DUT can be tested by performing the procedure of aligning, latching, testing and releasing the DUT and moving the DUT to the next test position each time an element in the DUT is tested.

Furthermore, ball plunger 66 can be placed at guide plate 62 or slide base 59 and hole 67 can be made on the surface of the body so that the tip of said ball plunger 66 engages when the DUT comes to a specific position in order to facilitate aligning the DUT at positions A to C.

The present invention further presents electrodes with which strong surface-contact pressure can be obtained with a relatively right load. The above-mentioned effect is obtained by the present invention when the electrodes have a 3-dimensional shape with a curved surface, such as a cylindrical shape or a spherical shape. In particular, when the electrode surface is cylindrical or spherical, there is no change in curvature and surface pressure does not change, even when the contact point moves on the same surface, and therefore, this is an effective means for obtaining test stability. The surface pressures of conventional flat-surface electrodes and the spherical and cylindrical electrodes of the present invention are compared and the electrode structure of the present invention is found to be superior, as will be discussed below.

Figure 8:
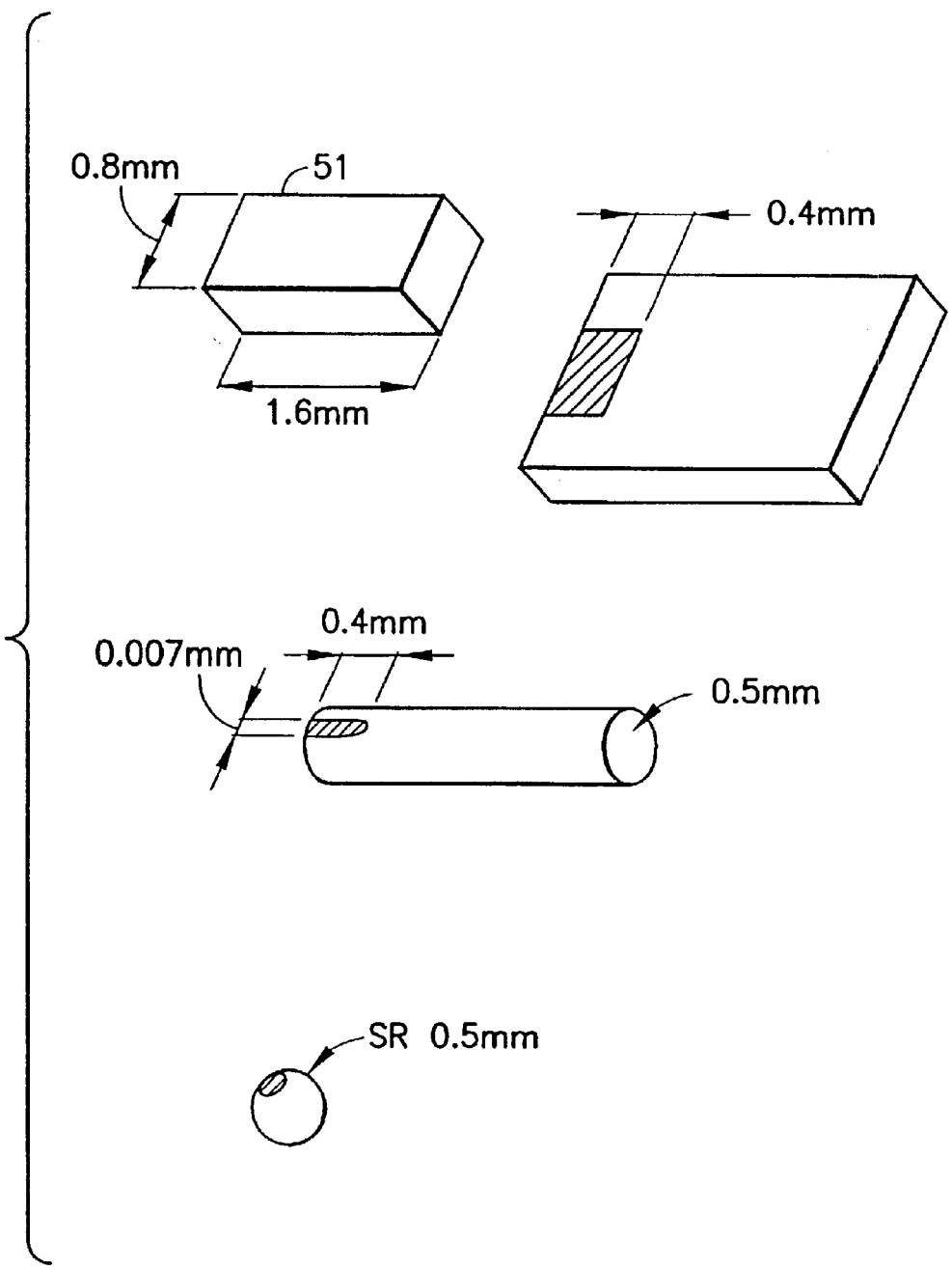
FIG. 8 explains the principle of the electrodes of the present invention.

The case is assumed where a load of 3N is applied to the top surface of a DUT, with a load of 1 N being applied to each of 3 contact surfaces (refer to FIG. 8). When the width of the DUT terminal is 0.4 mm and the length is 0.8 mm in the case of conventional flat-surface electrodes, the contact surface area S becomes $$S = 0.8 \text{ mm} \times 0.4 \text{ mm}$$

$$= 0.32 \text{ mm}^2$$

and pressure P at one contact point becomes $$P = 1 \text{N}/0.32 \text{ mm}^2$$

$$= 3.1 \text{ N/mm}^2$$

On the other hand, when the surface of the electrode is cylindrical, the site of contact of the electrode is subject to elastic deformation when a load is applied, as shown in FIG. 8 When the surface pressure is calculated by the Hertz's formula relating to contact of curved surfaces with an electrode of beryllium copper with a diameter of 0.5 mm and a DUT of alumina, the surface pressure is highest at the site of line contact prior to elastic deformation, becoming $$P = \sqrt{\frac{q}{\pi r_o} \frac{1}{\frac{1-v_1^2}{E_1} + \frac{1-v_2^2}{E_2}}}$$

$$= \sqrt{\frac{1}{\pi \times 0.25} \frac{1}{\frac{1-0.33^2}{11 \times 10^4} + \frac{1-0.26^2}{34 \times 10^4}}}$$

$$= 342.7 \; (N/mm^2)$$

where:
  $E_1$=Young's modulus of beryllium copper=$11 \times 10^4$ N/mm$^2$,
  $v_1$=Poisson ratio of beryllium copper=0.33,
  $E_2$=Young's modulus of alumina=$34 \times 10^4$ N/mm$^2$,
  $v_2$=Poisson ratio of alumina=0.26, and
  q=load applied to DUT (in this case, 1N).

Furthermore, when the surface of the electrode is a spherical surface with a radius of 0.5 mm, $$P = \sqrt[3]{\frac{6}{\pi^3} R_o^{-2} \left( \frac{1-v_1^2}{E_1} + \frac{1-v_2^2}{E_2} \right)^{-2} \times g}$$

$$= \sqrt[3]{\frac{6}{\pi^3} 0.5^{-2} \left( \frac{1-0.33^2}{11 \times 10^4} + \frac{1-0.26^2}{34 \times 10^4} \right)^{-2} \times 1}$$

$$= 1874 \; (N/mm^2)$$

Thus, even when the same load has been applied, the surface pressure at each contact point of an electrode with a cylindrical surface is 110-times what it is with a flat surface and the surface pressure of an electrode with a spherical surface is approximately 600-times that of a flat surface.

Figure 9:
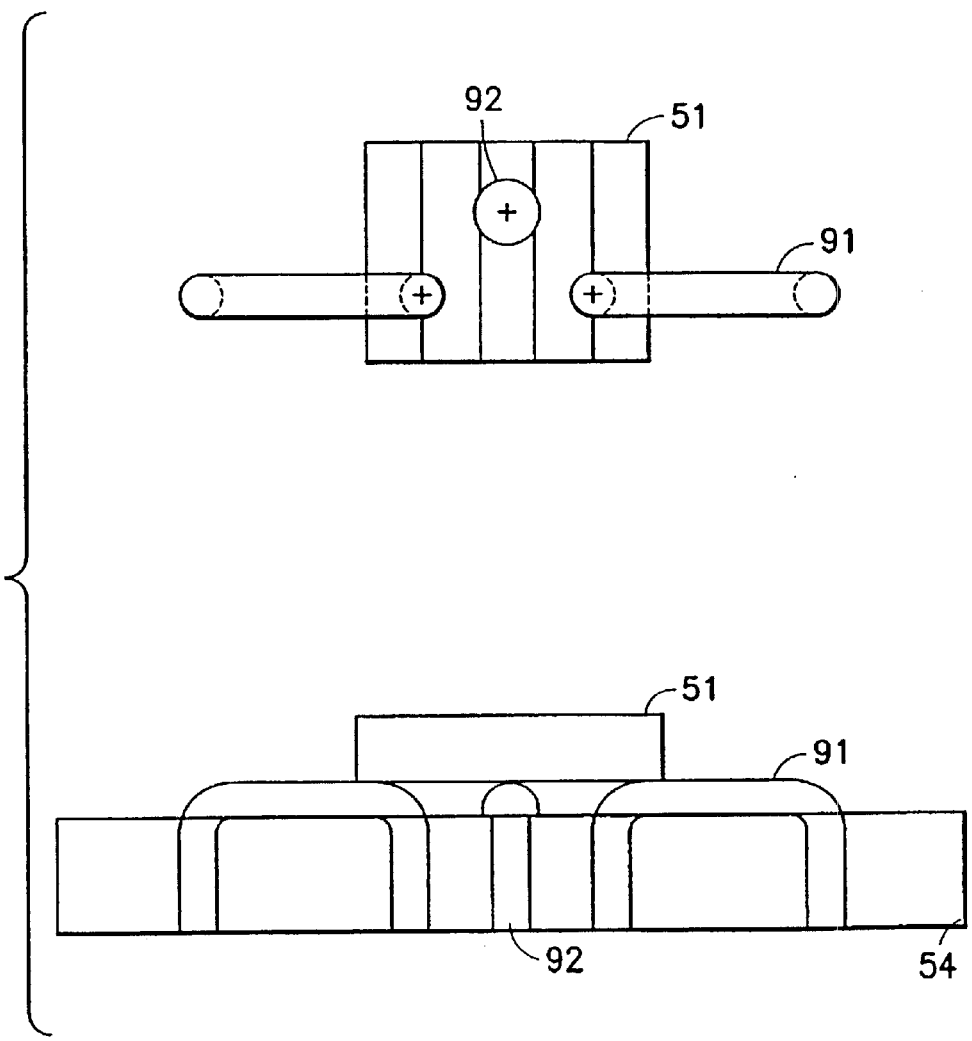
FIG. 9 is a top view and cross sectional view of the electrodes of the present invention.

Electrode 91, which is made by folding a linear cylindrical wire into an U-shaped form with rectangular corners as shown in FIG. 9, will be considered as an example that uses the above-mentioned electrode shape of the present invention. As is clear from FIG. 9, the demarcated parts on both sides that have been folded pass into through-holes made in electrode board 54 and are soldered from the back surface of the electrode. Moreover, pin-shaped electrode 92 with a semi-spherical tip, passes into through-holes made at points of equal distance from the ends of these two wire-shaped electrodes 91 facing one another and is similarly soldered. By means of this electrode arrangement, when the center terminal of a DUT is aligned so that it comes to the position of the pin-shaped electrode in the center in the case of a DUT under the conditions shown in FIG. 9, the electrodes can accommodate DUTs of different sizes within a specific range. It is not necessary for the center electrode 92 to be aligned in line with the electrodes 91 on both ends, and it is possible to arrange the electrode so that it is slightly offset from the row of electrodes 91 on both ends as shown in the FIG. 9. Thus, since the more distance between the center electrode and the electrodes on both ends can be maintained for a smaller DUT, making processing simple, and the DUT can be balanced on the electrode board.

Figure 10:
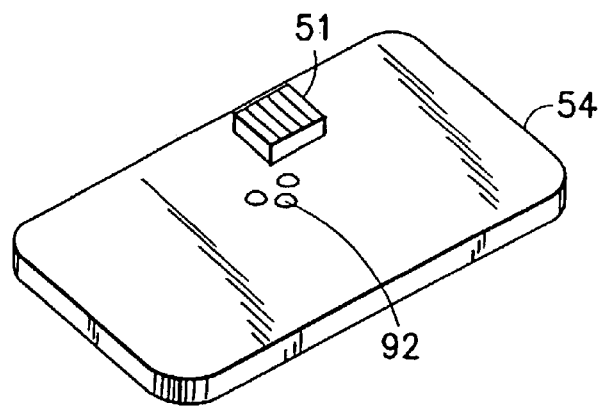
FIG. 10 shows an example of the electrode of the present invention.
Figure 11:
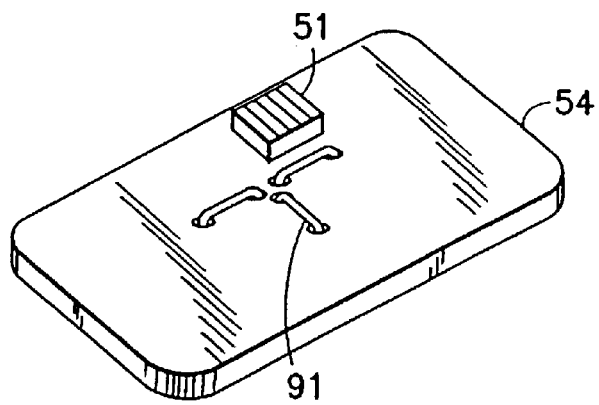
FIG. 11 shows an example of the electrode of the present invention.
Figure 12:
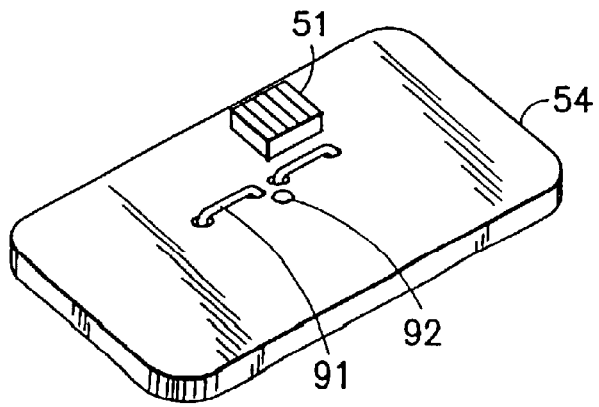
FIG. 12 is a perspective view of an example of the electrode in FIG. 9.

Moreover, by means of another example, it is possible to use pin-shaped electrodes for all 3 electrodes as shown in FIG. 10 (for simplicity, only 1 electrode group is illustrated). Moreover, it is possible to use wire electrodes for all 3 electrodes shown in FIG. 11 (similarly, only 1 electrode group is illustrated). The shape of these electrodes can be selected as needed in accordance with the size and shape of the DUT and the surface pressure that is desired.

The electrode forms discussed above are examples of the electrodes that can be used in the present invention in order to realize a testing platform that facilitates 3-terminal parts, achieves test results of reduced errors due to electrode length and contact resistance, and also achieves high test reproducibility as compared with the prior art.

As was previously explained in detail, the present invention presents a platform for testing electronic parts with which DUTs can be exchanged while still easily and accurately measuring multiple circuit elements in a 3-terminal device. Moreover, it is possible to simultaneously realize both exchangeability between DUTs and improvement in test precision and test reproducibility, which was not possible in the prior art. In particular, the present invention solves the conventional problem of instability of contact resistance because the surface pressure at the contact surface cannot be increased and makes it possible to maintain the necessary surface pressure without increase load applied to the top surface of the DUT. The present invention also solves the conventional problem of fluctuations in test results due to slight differences in the position at which the DUT is mounted before and after the DUT has been exchanged and thus has the effect of dramatically improving test reproducibility.

It should be understood that the foregoing description is only illustrative of the invention. The preferred embodiment examples of the present invention presented herein can be modified or revised by those skilled in the art without deviating from the invention. Consequently, the scope of the present invention is intended to encompass all such modifications and variances which fall within the appended claims. For instance, manual operation of DUT pressing means 52 and of DUT guide means 53 was previously described in the above-mentioned examples, but it is also possible to join an actuator means to slide base 59, clamp unit 55 or holder 56, install a control means for controlling the same inside the testing device or outside the testing device, and operate the actuator in synchronization with the testing sequence of the testing device so that the series of operations of: DUT testing—DUT release, DUT movement, DUT locking, and test result determination (i.e., testing) are automated.

What is claimed is:

1. A platform for testing electronic parts, comprising:
  a body;
  a clamp unit with a moving piece that moves up and down;
  a holder with a first through-hole, which is joined in the moving piece and extends along the direction of movement of the moving piece, and a second through-hole threaded, which communicates with the first through-hole and extends perpendicular to the first through-hole;
  a rod which passes into the first through-hole of the holder so that it can slide, a knob for anchoring said rod to the holder, which moves the second through-hole;
  a sliding unit which is comprised of two sliding members, one of which is anchored to the body;
  a slide base which is joined to one of the members of the sliding unit and the clamp unit;
  a guide plate, which is joined to the slide base and has an opening for holding a device under test (DUT) in the guide plate; and
  an electrode plate being anchored to the body and having multiple electrode groups, wherein at least one of said electrode groups includes three electrodes, two of said three electrodes each having a cylindrical surface for contacting said DUT and one of said three electrodes having a spherical surface for contacting said DUT.

2. An electrode assembly of a electronic parts testing platform, said electrode assembly comprising:

an electronic board;

a first electrode having a terminal end anchored to said electrode board and a free end projecting from said electrode board having a cylindrical surface for contacting a first terminal of a device under test (DUT); and a second electrode having a terminal end anchored to said electrode board and a free end projecting from said electrode board having a spherical surface for contacting a second terminal of said DUT.

3. The electrode assembly according to claim 2, further comprising a third electrode having a terminal end anchored to said electrode board and a free end projecting from said electrode board having a cylindrical surface for containing a third terminal of said DUT.

4. The electrode assembly according to claim 3, wherein said free end of said second electrode is located at a position equivalent from said terminal end of said first and third electrodes.

5. The electrode assembly to claim 4, wherein each of said first and third electrodes comprises a cylindrical wire having a U-shaped form.

* * * * *